United States Patent
Maeda et al.

(10) Patent No.: US 10,840,094 B2
(45) Date of Patent: Nov. 17, 2020

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kiyohiko Maeda, Toyama (JP); Masato Terasaki, Toyama (JP); Yasuhiro Megawa, Toyama (JP); Takahiro Miyakura, Toyama (JP); Akito Hirano, Toyama (JP); Takashi Nakagawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/234,087

(22) Filed: Dec. 27, 2018

(65) Prior Publication Data
US 2019/0206679 A1 Jul. 4, 2019

(30) Foreign Application Priority Data
Dec. 28, 2017 (JP) .................................. 2017-253174

(51) Int. Cl.
| | |
|---|---|
| *H01L 21/02* | (2006.01) |
| *C23C 16/46* | (2006.01) |
| *C23C 16/455* | (2006.01) |
| *C23C 16/24* | (2006.01) |
| *C23C 16/06* | (2006.01) |

(52) U.S. Cl.
CPC ........ *H01L 21/02667* (2013.01); *C23C 16/06* (2013.01); *C23C 16/24* (2013.01);
(Continued)

(58) Field of Classification Search
CPC .......... H01L 21/02667; H01L 21/0262; H01L 21/02494; H01L 21/02502;
(Continued)

(56) References Cited

U.S. PATENT DOCUMENTS

| | | | |
|---|---|---|---|
| 2002/0076871 A1* | 6/2002 | Yanagawa | H01L 21/268 438/200 |
| 2005/0151209 A1 | 7/2005 | Yamamoto et al. | |

(Continued)

FOREIGN PATENT DOCUMENTS

| | | |
|---|---|---|
| JP | 08-203847 A | 8/1996 |
| JP | 2005-150701 A | 6/2005 |

(Continued)

OTHER PUBLICATIONS

Singaporean Search Report and Written Opinion dated Jun. 17, 2019 for the Singaporean Patent Application No. 10201811688W.
(Continued)

*Primary Examiner* — Caleen O Sullivan
(74) *Attorney, Agent, or Firm* — Volpe Koenig

(57) ABSTRACT

There is provided a technique that includes: (a) forming a silicon germanium film in an amorphous state so as to embed an inside of a recess formed on a surface of a substrate, by supplying a first silicon-containing gas and a germanium-containing gas to the substrate at a first temperature; (b) raising a temperature of the substrate from the first temperature to a second temperature, which is higher than the first temperature; and (c) forming a silicon film on the silicon germanium film by supplying a second silicon-containing gas to the substrate at the second temperature, wherein in (c), the silicon germanium film as a base of the silicon film is crystallized while the silicon film is formed.

19 Claims, 10 Drawing Sheets

(52) U.S. Cl.
CPC ............ *C23C 16/455* (2013.01); *C23C 16/46* (2013.01); *H01L 21/0245* (2013.01); *H01L 21/0262* (2013.01); *H01L 21/02381* (2013.01); *H01L 21/02488* (2013.01); *H01L 21/02494* (2013.01); *H01L 21/02502* (2013.01); *H01L 21/02513* (2013.01); *H01L 21/02532* (2013.01); *H01L 21/02576* (2013.01); *H01L 21/02579* (2013.01); *H01L 21/02592* (2013.01); *H01L 21/02595* (2013.01); *H01L 21/02645* (2013.01)

(58) Field of Classification Search
CPC ......... H01L 21/02579; H01L 21/02576; H01L 21/02513; H01L 21/02488; H01L 21/02532; H01L 21/02592; H01L 21/02595; H01L 21/02645; H01L 21/02381; H01L 21/0245; H01L 21/67017; C23C 16/06; C23C 16/46; C23C 16/455; C23C 16/24; C23C 16/45578; C23C 16/4584; C23C 16/52; C23C 16/30; C23C 16/045; C23C 16/0236
USPC ........................................................ 438/486
See application file for complete search history.

(56) References Cited

U.S. PATENT DOCUMENTS

| | | |
|---|---|---|
| 2005/0170617 A1 | 8/2005 | Kurokawa et al. |
| 2005/0186750 A1 | 8/2005 | Lee et al. |
| 2010/0255662 A1 | 10/2010 | Witvrouw |
| 2011/0084308 A1 | 4/2011 | Loh et al. |
| 2013/0084693 A1 | 4/2013 | Kakimoto et al. |
| 2013/0149846 A1 | 6/2013 | Koshi et al. |
| 2014/0080321 A1 | 3/2014 | Hirose et al. |
| 2016/0141173 A1 | 5/2016 | Moriya et al. |
| 2017/0253989 A1 | 9/2017 | Chiba et al. |
| 2017/0256450 A1 | 9/2017 | Chiba et al. |

FOREIGN PATENT DOCUMENTS

| | | |
|---|---|---|
| JP | 2013-082986 A | 5/2013 |
| JP | 2013-197307 A | 9/2013 |
| JP | 2014-060227 A | 4/2014 |
| JP | 2014-067796 A | 4/2014 |
| JP | 2016-105457 A | 6/2016 |
| KR | 10-2008-0089327 A | 10/2008 |
| KR | 10-2017-0104381 A | 9/2017 |
| WO | 2012/029661 A1 | 3/2012 |

OTHER PUBLICATIONS

Korean Office Action dated Dec. 10, 2019 for the Korean Patent Application No. 10-2018-0170252.
Japanese Office Action dated Jul. 7, 2020 for the Japanese Patent Application No. 2017-253174.
Taiwanese Office Action dated Mar. 18, 2020 for the Taiwanese Patent Application No. 107145707.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2017-253174, filed on Dec. 28, 2017, the entire contents of which are incorporated herein by reference.

TECHNICAL FIELD

The present disclosure relates to a method of manufacturing a semiconductor device, a substrate processing apparatus, and a recording medium.

BACKGROUND

As an example of a process of manufacturing a semiconductor device, a substrate processing process of forming a film so as to embed the inside of a recess formed on a surface of a substrate is often carried out.

SUMMARY

The present disclosure provides some embodiments of a technique capable of improving embedding characteristics by a film in a recess formed on a surface of a substrate.

According to one embodiment of the present disclosure, there is provided a technique that includes: (a) forming a silicon germanium film in an amorphous state so as to embed an inside of a recess formed on a surface of a substrate, by supplying a first silicon-containing gas and a germanium-containing gas to the substrate at a first temperature; (b) raising a temperature of the substrate from the first temperature to a second temperature, which is higher than the first temperature; and (c) forming a silicon film on the silicon germanium film by supplying a second silicon-containing gas to the substrate at the second temperature, wherein in (c), the silicon germanium film as a base of the silicon film is crystallized while the silicon film is formed.

DETAILED DESCRIPTION

One Embodiment of the Present Disclosure

One embodiment of the present disclosure will now be described with reference to FIGS. 1 to 5D.

(1) Configuration of the Substrate Processing Apparatus

Figure 1:
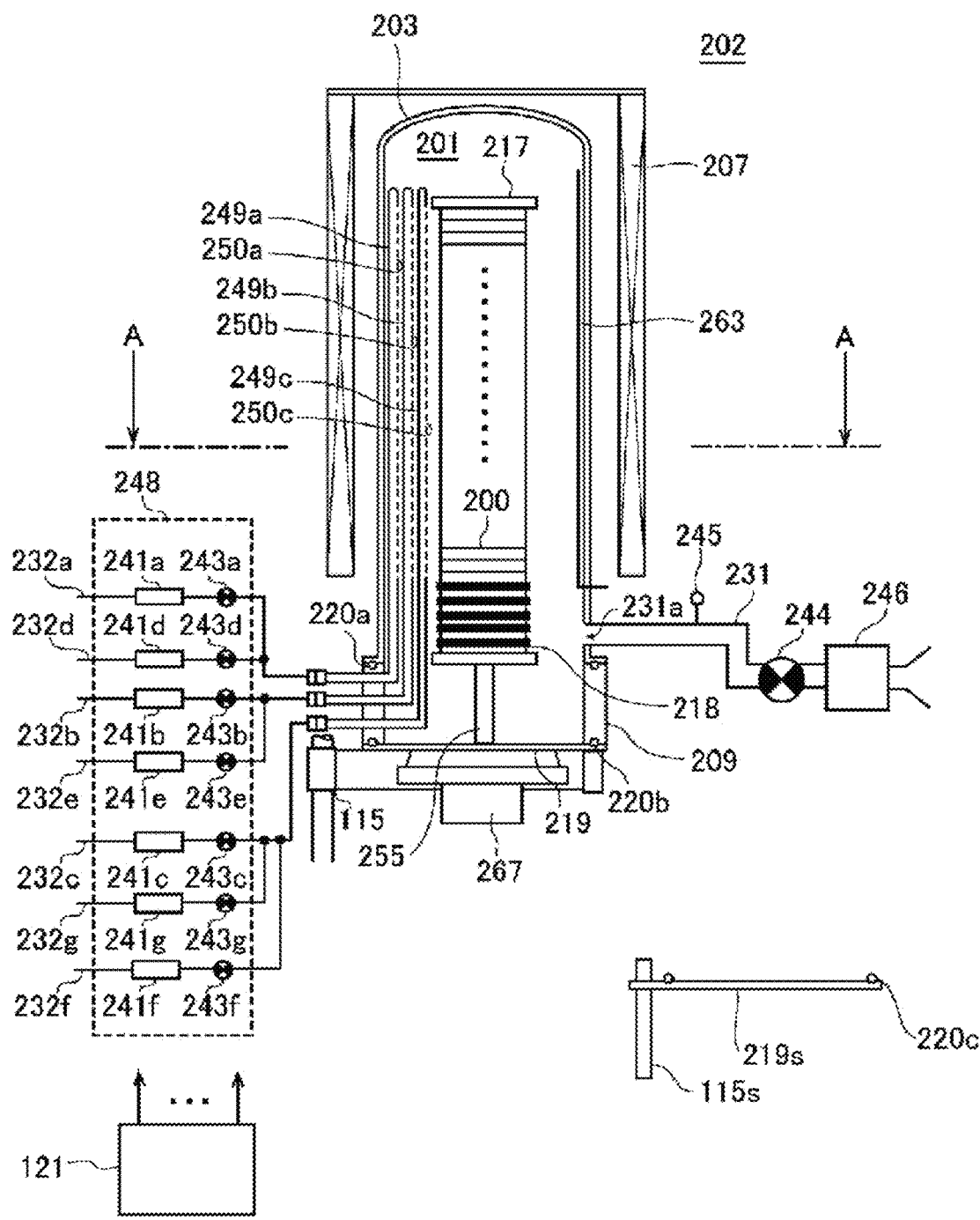
FIG. 1 is a schematic configuration diagram of a vertical type process furnace of a substrate processing apparatus suitably used in an embodiment of the present disclosure, in which a portion of the process furnace is illustrated in a vertical cross sectional view.

As illustrated in FIG. 1, a process furnace 202 includes a heater 207 as a heating mechanism (temperature adjustment part). The heater 207 has a cylindrical shape and is supported by a retaining plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material such as, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to accommodate wafers 200 as substrates. The processing of the wafers 200 is performed in the process chamber 201.

Nozzles 249a to 249c are installed in the process chamber 201 so as to penetrate a sidewall of the manifold 209. Gas supply pipes 232a to 232c are connected to the nozzles 249a to 249c, respectively.

Mass flow controllers (MFCs) 241a to 241c, which are flow rate controllers (flow rate control parts), and valves 243a to 243c, which are opening/closing valves, are installed in the gas supply pipes 232a to 232c sequentially from the upstream sides of gas flow, respectively. Gas supply pipes 232d and 232e are respectively connected to the gas supply pipes 232a and 232b at the downstream side of the valves 243a and 243b, respectively. Gas supply pipes 232f and 232g are connected to the gas supply pipe 232c at the downstream side of the valve 243c. MFCs 241d to 241g and valves 243d to 243g are installed in the gas supply pipes 232d to 232g sequentially from the upstream sides of gas flow, respectively.

Figure 2:
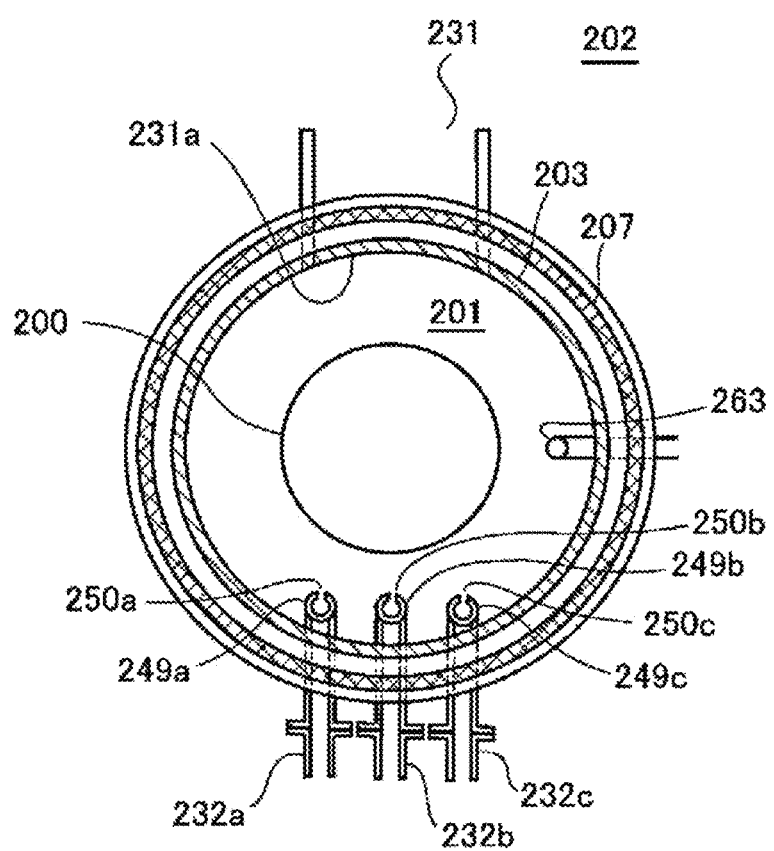
FIG. 2 is a schematic configuration diagram of the vertical type process furnace of the substrate processing apparatus suitably used in an embodiment of the present disclosure, in which a portion of the process furnace is illustrated in a cross sectional view taken along line A-A in FIG. 1.

As illustrated in FIG. 2, the nozzles 249a to 249c are disposed in a space with an annular plan-view shape between the inner wall of the reaction tube 203 and the wafers 200 such that the nozzles 249a to 249c extend upward along a stacking direction of the wafers 200 from a lower portion of the inner wall of the reaction tube 203 to an upper portion of the inner wall of the reaction tube 203. That is, the nozzles 249a to 249c are installed at a lateral side of a wafer arrangement region in which the wafers 200 are arranged, namely in a region which horizontally surrounds the wafer arrangement region, so as to extend along the wafer arrangement region. Gas supply holes 250a to 250c for supplying a gas are formed on the side surfaces of the nozzles 249a to 249c, respectively. The gas supply holes 250a to 250c are opened to oppose (face) an exhaust port 231a in plan view, so as to allow a gas to be supplied toward the wafers 200. The gas supply holes 250a to 250c may be formed in a plural number between the lower portion of the reaction tube 203 and the upper portion of the reaction tube 203.

A silane-based gas, which is a silicon (Si)-containing gas, is supplied from the gas supply pipe 232a into the process chamber 201 via the MFC 241a, the valve 243a, and the nozzle 249a. As the silane-based gas, it may be possible to use a silicon hydride gas containing no halogen element, for example, a monosilane ($SiH_4$, abbreviation: MS) gas or a disilane ($Si_2H_6$, abbreviation: DS) gas.

A gas containing Si and a halogen element, i.e., a halosilane-based gas, is supplied from the gas supply pipe 232b into the process chamber 201 via the MFC 241b, the valve 243b, and the nozzle 249b. The halogen element may include chlorine (Cl), fluorine (F), bromine (Br), iodine (I), and the like. As the halosilane-based gas, it may be possible to use a chlorosilane-based gas containing Si and Cl, for example, a dichlorosilane ($SiH_2Cl_2$, abbreviation: DCS) gas.

A germane-based gas, which is a germanium (Ge)-containing gas, is supplied from the gas supply pipe 232c into the process chamber 201 via the MFC 241c, the valve 243c, and the nozzle 249c. As the germane-based gas, it may be possible to use a germanium hydride gas containing no halogen element, for example, a monogermane ($GeH_4$, abbreviation: MG) gas.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c. The $N_2$ gas acts as a purge gas, a carrier gas, a dilution gas, or the like.

A dopant gas, for example, a gas containing an impurity (dopant), is supplied from the gas supply pipe 232g into the process chamber 201 via the MFC 241g, the valve 243g, the gas supply pipe 232c, and the nozzle 249c. As the dopant gas, it may be possible to use a gas containing an element which is one of group III element (group 13 element) and group V element (group 15 element) and which becomes a solid by itself, and it may be possible to use, for example, a phosphine ($PH_3$, abbreviation: PH) gas which is a gas containing group V element.

A processing gas supply system mainly includes the gas supply pipes 232a to 232c, the MFCs 241a to 241c, and the valves 243a to 243c. The gas supply pipe 232g, the MFC 241g, and the valve 243g may be included in the processing gas supply system. An inert gas supply system mainly includes the gas supply pipes 232d to 232f, the MFCs 241d to 241f, and the valves 243d to 243f. In the present disclosure, a gas supply system including the gas supply pipe 232a, the MFC 241a, and the valve 243a may be referred to as a first supply system. A gas supply system including the gas supply pipe 232c, the MFC 241c, and the valve 243c may be referred to as a second supply system.

One or all of various supply systems described above may be configured as an integrated supply system 248 in which the valves 243a to 243g, the MFCs 241a to 241g, and the like are integrated. It is configured in a manner that the integrated supply system 248 is connected to each of the gas supply pipes 232a to 232g so that the supply operation of various kinds of gases into the gas supply pipes 232a to 232g, i.e., the opening/closing operation of the valves 243a to 243g, the flow rate-adjusting operation by the MFCs 241a to 241g or the like, is controlled by a controller 121 which will be described below. The integrated supply system 248 is configured as an integral type or division type integrated unit, and is also configured such that it is detachable from the gas supply pipes 232a to 232g or the like, to perform the maintenance, replacement, expansion or the like of the integrated supply system 248, on an integrated unit basis.

The exhaust port 231a configured to exhaust the internal atmosphere of the process chamber 201 is installed at a lower side of the sidewall of the reaction tube 203. As illustrated in FIG. 2, the exhaust port 231a is installed at a position opposing (facing) the nozzles 249a to 249c (the gas supply holes 250a to 250c) in plan view, with the wafers 200 interposed therebetween. The exhaust port 231a may be installed between the lower portion and the upper portion of the sidewall of the reaction tube 203, namely along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that the vacuum exhaust of the interior of the process chamber 201 and the vacuum exhaust stop thereof can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system mainly includes the exhaust pipe 231, the APC valve 244 and the pressure sensor 245. The vacuum pump 246 may be included in the exhaust system.

A seal cap 219, which serves as a furnace opening cover configured to hermetically seal a lower end opening of the manifold 209, is installed under the manifold 209. The seal cap 219 is made of a metal material such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate a boat 217, which will be described below, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from the process chamber 201 by moving the seal cap 219 up and down. A shutter 219s as a furnace opening cover capable of hermetically sealing the lower end opening of the manifold 209, with the boat 217 unloaded from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end portion of the manifold 209 is installed on an upper surface of the shutter 219s. An opening/closing operation (an up-down movement operation or a rotational movement operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as, e.g., quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
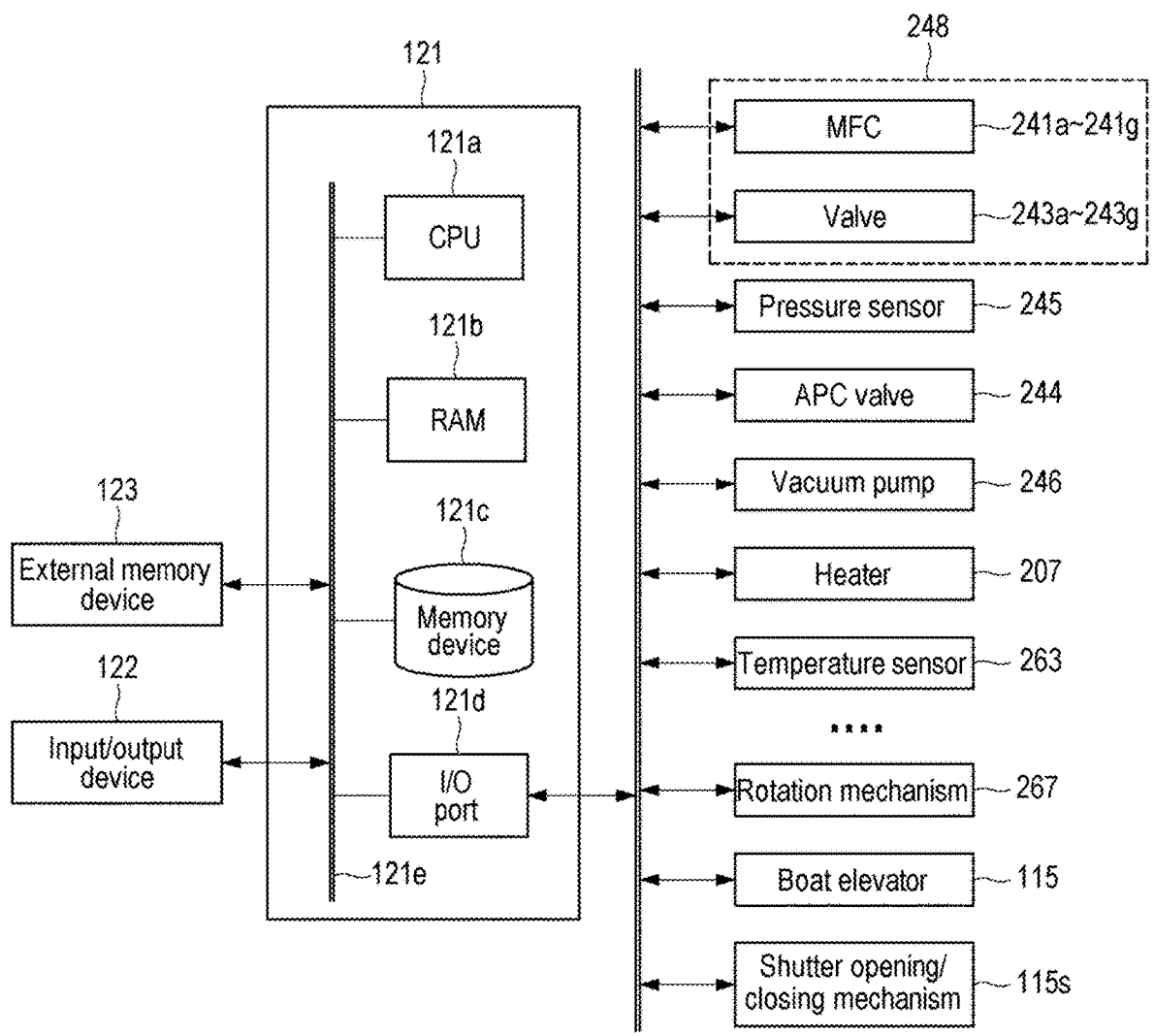
FIG. 3 is a schematic configuration diagram of a controller of the substrate processing apparatus suitably used in an embodiment of the present disclosure, in which a control system of the controller is illustrated in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241g, the valves 243a to 243g, the pressure sensor 245, the APC valve 244, the vacuum pump 246, the temperature sensor 263, the heater 207, the rotation mechanism 267, the boat elevator 115, the shutter opening/closing mechanism 115s, and the like, as mentioned above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow rate-adjusting operation of various kinds of gases by the MFCs 241a to 241g, the opening/closing operation of the valves 243a to 243g, the opening/closing operation of the APC valve 244, the pressure-regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing

A substrate processing sequence example of forming a film on a wafer 200 as a substrate using the aforementioned substrate processing apparatus, i.e., a film-forming sequence example, which is one of the processes for manufacturing a semiconductor device, will be described below mainly with reference to FIG. 4. In the following descriptions, the operations of the respective parts constituting the substrate processing apparatus are controlled by the controller 121.

Figure 4:
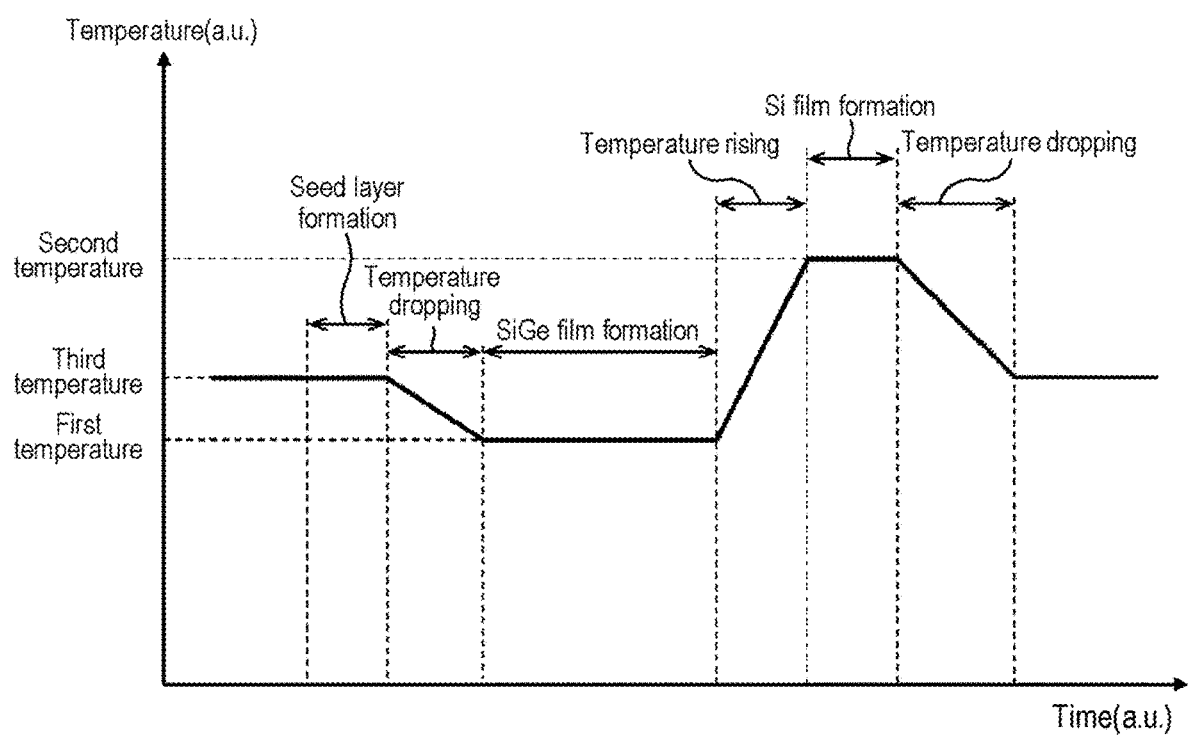
FIG. 4 is a diagram illustrating a film-forming sequence according to one embodiment of the present disclosure.

In the film-forming sequence illustrated in FIG. 4, there are performed: a step of suppling an MS gas as an Si-containing gas and an MG gas as a Ge-containing gas to a wafer 200 at a first temperature to form a silicon germanium film (SiGe film) in an amorphous state (non-crystalline state) so as to embed the inside of a recess formed on a surface of the wafer 200 (SiGe film-forming step); a step of raising the temperature of the wafer 200 from the first temperature to a second temperature, which is higher than the first temperature (temperature-rising step); and a step of supplying an MS gas as an Si-containing gas to the wafer 200 at the second temperature to form a silicon film (Si film) on the SiGe film (Si film-forming step), wherein at the Si film-forming step, the SiGe film as a base of the Si film is crystallized while forming the Si film.

Furthermore, in the film-forming sequence illustrated in FIG. 4, before performing the SiGe film-forming step, there is performed a step of supplying a DS gas as an Si-containing gas to the wafer 200 at a third temperature, which is equal to or higher than the first temperature and lower than the second temperature, to form a seed layer on an inner surface of the recess (seed layer-forming step). Specifically, at the seed layer-forming step, a step of supplying a DCS gas as a halogen element-containing gas to the wafer 200 and a step of supplying a DS gas to the wafer 200 are alternately performed a predetermined number of times to form the seed layer. Thereafter, i.e., after performing the seed layer-forming step and before performing the SiGe film-forming step, there is performed a step of dropping the temperature of the wafer 200 from the third temperature to the first temperature (temperature-dropping step).

In the present disclosure, for the sake of convenience, the film-forming sequence described above may be denoted as follows. The same denotation will be used in the modifications and the like as described hereinbelow.

(DCS→DS)×n→MS+MG→MS⇒Si/SiGe/Seed

When the term "wafer" is used herein, it may refer to "a wafer itself" or "a laminated body of a wafer and a predetermined layer or film formed on the surface of the wafer." In addition, when the phrase "a surface of a wafer" is used herein, it may refer to "a surface of a wafer itself" or "a surface of a predetermined layer or the like formed on a wafer. Furthermore, in the present disclosure, the expression "a predetermined layer is formed on a wafer" may mean that "a predetermined layer is directly formed on a surface of a wafer itself" or that "a predetermined layer is formed on a layer or the like formed on a wafer. In addition, when the term "substrate" is used herein, it may be synonymous with the term "wafer."

(Wafer Charging and Boat Loading)

If a plurality of wafers 200 is charged in the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 via the O-ring 220b.

Figure 5A:
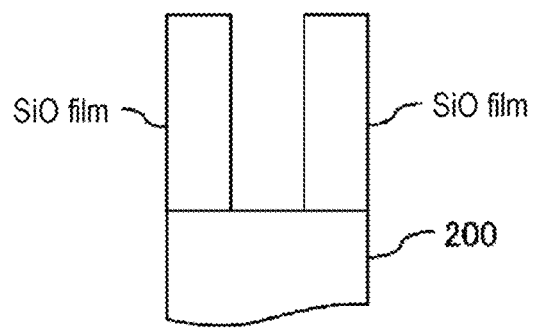
FIG. 5A is an enlarged cross sectional view of a surface of a substrate having, on the surface, a recess whose bottom portion is made of single crystal silicon and side portion is formed of an insulating film.

As the wafers 200, for example, an Si substrate made of single crystal Si, or a substrate in which a single crystal Si film is formed on surface of the substrate may be used. As illustrated in FIG. 5A, an insulating film such as, e.g., a silicon oxide film ($SiO_2$ film, hereinafter also referred to as an SiO film), is formed in a portion of the surface of the wafers 200 to form a recess. A bottom portion of the recess is made of single crystal Si, and a side portion of the recess is formed of an insulating film. The single crystal Si and the insulating film are exposed to the surface of the wafers 200. In addition to the SiO film, the insulating film may be an Si-based insulating film such as a silicon nitride film (SiN film), a silicon carbide film (SiC film), a silicon carbonitride film (SiCN film), a silicon oxynitride film (SiON film), a silicon oxycarbide film (SiOC film), a silicon oxycarbonitride film (SiOCN film), a silicon boronitride film (SiBN film) or a silicon borocarbonitride film (SiBCN film), or a metal-based insulating film such as an aluminum oxide film (AlO film), a hafnium oxide film (HfO film), a zirconium oxide film (ZrO film), a titanium oxide film (TiO film) or the like.

(Pressure Adjustment and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. Both of the exhaust of the interior of the process chamber 201 and the heating and rotation of the wafers 200 may be continuously performed at least until the processing of the wafers 200 is completed.

(Seed Layer-Forming Step)

Next, the following steps 1 and 2 are sequentially performed.

[Step 1]

At this step, a DCS gas is supplied from the nozzle 249b to the wafer 200 accommodated in the process chamber 201. Specifically, the valve 243b is opened to allow a DCS gas to flow through the gas supply pipe 232b. The flow rate of the DCS gas is adjusted by the MFC 241b. The DCS gas is supplied into the process chamber 201 via the nozzle 249b and is exhausted from the exhaust port 231a. At this time, the DCS gas is supplied to the wafer 200. Simultaneously, the valves 243d to 243f are opened to allow an $N_2$ gas to flow through the gas supply pipes 232d to 232f.

By supplying the DCS gas to the wafer 200 under the processing conditions as described hereinbelow, it is possible to remove a natural oxide film, an impurity or the like from the surface of the wafer 200 by a treatment action (etching action) of the DCS gas so as to clean the surface. Thus, the surface of the wafer 200 may be a surface where adsorption of Si, i.e., formation of a seed layer, is likely to proceed at step 2 which will be described below.

After the surface of the wafer 200, namely the inner surface of the recess, is cleaned, the valve 243b is closed to stop the supply of the DCS gas into the process chamber 201. Then, the interior of the process chamber 201 is vacuum-exhausted so as to remove the gas or the like remaining in the process chamber 201 from the interior of the process chamber 201. At this time, the valves 243d to 243f are opened to supply an $N_2$ gas into the process chamber 201 via the nozzles 249a to 249c. The $N_2$ gas supplied from the nozzles 249a to 249c acts as a purge gas. Thus, the interior of the process chamber 201 is purged (purge step).

[Step 2]

After step 1 is completed, a DS gas is supplied from the nozzle 249a to the wafer 200 accommodated in the process chamber 201, namely to the surface of the cleaned wafer 200. Specifically, the valve 243a is opened to allow a DS gas to flow through the gas supply pipe 232a. The flow rate of the DS gas is adjusted by the MFC 241a. The DS gas is supplied into the process chamber 201 via the nozzle 249a and is exhausted from the exhaust port 231a. At this time, the DS gas is supplied to the wafer 200. Simultaneously, the valves 243d to 243f may be opened to allow an $N_2$ gas to flow through the gas supply pipes 232d to 232f.

By supplying the DS gas to the wafer 200 under the processing conditions as described hereinbelow, it is possible to adsorb Si contained in the DS onto the surface of the wafer 200 cleaned at step 1 so as to form a seed (nucleus). Under the processing conditions as described hereinbelow, it is possible to epitaxially grow (vapor-phase epitaxial growth) an Si crystal as a nucleus on the single crystal Si constituting the bottom portion of the recess. Furthermore, it is possible to make the crystal structure of the nucleus formed on the insulating film constituting the side portion or the like of the recess be in an amorphous (non-crystalline) state.

After the nucleus is formed on the surface of the wafer 200, namely on the inner surface of the recess, the valve 243a is closed to stop the supply of the DS gas into the process chamber 201. Then, the gas or the like remaining in the process chamber 201 is removed from the interior of the process chamber 201 according to the same processing procedures as those of the purge step of step 1.

[Performing a Predetermined Number of Times]

Figure 5B:
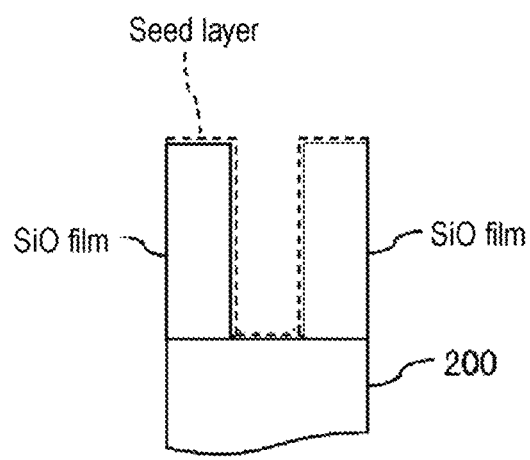
FIG. 5B is an enlarged cross sectional view of the surface of the substrate in which a seed layer is formed on an inner surface of the recess.

A cycle which alternately, i.e., non-synchronously and non-simultaneously, performs steps 1 and 2 described above is implemented a predetermined number of times (n times) (where n is an integer of 1 or larger). Thus, as illustrated in FIG. 5B, a seed layer (Si seed layer) can be formed on the wafer 200, namely on the inner surface of the recess. An epitaxial Si layer is grown as the seed layer on the single crystal Si constituting the bottom portion of the recess. In addition, an amorphous Si layer is grown as the seed layer on the insulating film constituting the side portion or the like of the recess. The thickness of the seed layer may be set to a thickness which falls within a range of, for example, 1 to 10 nm.

The example of the processing conditions at step 1 may be described as follows:

Flow rate of supplying DCS gas: 10 to 1,000 sccm
Time period of supplying DCS gas: 0.5 to 10 minutes
Flow rate of supplying $N_2$ gas (per gas supply pipe): 0 to 10,000 sccm
Processing temperature (third temperature): 350 to 450 degrees C.
Processing pressure: 400 to 1,000 Pa.

The example of the processing conditions at step 2 may be described as follows:

Flow rate of supplying DS gas: 10 to 1,000 sccm
Time period of supplying DS gas: 0.5 to 10 minutes.
Other processing conditions may be similar to the processing conditions of step 1.

At step 1, it may be possible to use, instead of the DCS gas, a chlorosilane-based gas such as a monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, Abbreviation: HCDS) gas, an octachlorotrisilane ($Si_3Cl_8$, abbreviation: OCTS) gas or the like. Furthermore, it may be possible to use, instead of these gases, a tetrafluorosilane ($SiF_4$) gas, a tetrabromosilane ($SiBr_4$) gas, a tetraiodosilane ($SiI_4$) gas, or the like. That is, it may be possible to use, instead of the chlorosilane-based gas, a halosilane-based gas such as a fluorosilane-based gas, a bromosilane-based gas, an iodosilane-based gas or the like. In addition, it may be possible to use, instead of these gases, an Si-free halogen-based gas such as a hydrogen chloride (HCl) gas, a chlorine ($Cl_2$) gas, a trichloroborane ($BCl_3$) gas, a chlorine fluoride ($ClF_3$) gas or the like.

At step 2, it may be possible to use, instead of the DS gas, a silicon hydride gas such as an MS gas, a trisilane ($Si_3H_8$) gas, a tetrasilane ($Si_4H_{10}$) gas, a pentasilane ($Si_5H_{12}$) gas, a hexasilane ($Si_6H_{14}$) gas or the like.

Furthermore, at step 2, it may be possible to use, instead of the DS gas, an organosilane-based gas such as a monomethylsilane ($SiH_3CH_3$, abbreviation: MMS) gas, a dimethylsilane ($SiH_2(CH_3)_2$, abbreviation: DMS) gas, a monoethylsilane ($SiH_3C_2H_5$, abbreviation: MES) gas, a vinylsilane ($SiH_3C_2H_3$, abbreviation: VS) gas, a monomethyldisilane ($SiH_3SiH_2CH_3$, abbreviation: MMDS) gas, a hexamethyldisilane (($CH_3)_3$—Si—Si—$(CH_3)_3$, abbreviation: HMDS) gas, a 1,4-disilabutane ($SiH_3CH_2CH_2SiH_3$, abbreviation: 1,4-DSB) gas, a 1,3-disilabutane ($SiH_3CH_2SiH_2CH_3$, abbreviation: 1,3-DSB) gas, a 1,3,5-trisilapentane ($SiH_3CH_2SiH_2CH_2SiH_3$, abbreviation: 1,3,5-TSP) gas or the like.

In addition, at step 2, it may be possible to use, instead of the DS gas, an aminosilane-based gas such as a tetrakis-dimethylaminosilane ($Si[N(CH_3)_2]_4$, abbreviation: 4D-MAS) gas, a tris-dimethylaminosilane ($Si[N(CH_3)_2]_3H$, abbreviation: 3DMAS) gas, a bis-diethylaminosilane ($Si[N(C_2H_5)_2]_2H_2$, abbreviation: BDEAS) gas, a bis-tert-butylaminosilane ($SiH_2[NH(C_4H_9)]_2$, abbreviation: BTBAS) gas, a diisopropylaminosilane ($SiH_3N[CH(CH_3)_2]_2$, abbreviation: DIPAS) gas or the like.

At steps 1 and 2, it may be possible to use, instead of the $N_2$ gas, a rare gas such as an Ar gas, an He gas, an Ne gas, a Xe gas or the like. This is also the same at each step as described hereinbelow.

(Temperature-Dropping Step)

After the seed layer-forming step is completed, the output of the heater 207 is adjusted so that the internal temperature of the process chamber 201, i.e., the temperature of the wafer 200, is changed from the aforementioned third temperature to the first temperature, which is equal to or lower than the third temperature. When this step is performed, the valves 243d to 243f are opened and an $N_2$ gas is supplied into the process chamber 201 via the nozzles 249a to 249c to purge the interior of the process chamber 201. After the internal temperature of the process chamber 201, i.e., the temperature of the wafer 200 becomes the first temperature to be stable, an SiGe film-forming step as described hereinbelow starts.

(SiGe Film-Forming Step)

At this step, an MS gas is supplied from the nozzle 249a and an MG gas is supplied from the nozzle 249c, to the surface of the seed layer formed on the wafer 200 accommodated in the process chamber 201, i.e., the wafer 200.

Specifically, the valve 243a is opened to allow an MS gas to flow through the gas supply pipe 232a. The flow rate of the MS gas is adjusted by the MFC 241a. The MS gas is supplied into the process chamber 201 via the nozzle 249a and is exhausted from the exhaust port 231a. Furthermore, the valve 243c is opened to allow an MG gas to flow through the gas supply pipe 232c. The flow rate of the MG gas is adjusted by the MFC 241c. The MG gas is supplied into the process chamber 201 via the nozzle 249c and is exhausted from the exhaust port 231a. In addition, the MS gas and the MG gas are mixed in the process chamber 201. At this time, the MS gas and the MG gas are simultaneously and together supplied to the wafer 200. Simultaneously, the valves 243*d* to 243*f* are opened to allow an $N_2$ gas to flow through the gas supply pipes 232*d* to 232*f*.

Figure 5C:
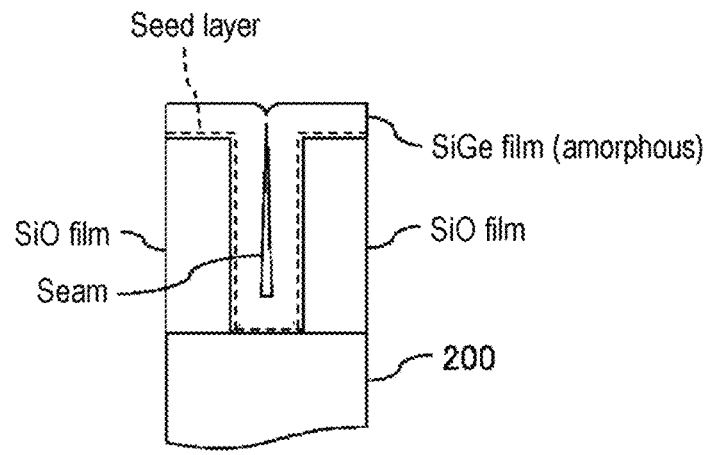
FIG. 5C is an enlarged cross sectional view of the surface of the substrate on which an SiGe film is formed so as to embed the inside of the recess.

By supplying the MS gas and the MG gas to the wafer 200 under the processing conditions as described hereinbelow, it is possible to adsorb (deposit) Si and Ge onto the surface of the wafer 200, namely on the seed layer formed on the wafer 200, to form an SiGe film so as to embed the inside of the recess. As illustrated in FIG. 5C, the SiGe film formed so as to embed the inside of the recess becomes a film having a seam or a void (which will be generally referred to simply as a seam or the like below).

In addition, at this step, an SiGe film in an amorphous state, i.e., a non-crystalline state, is formed. That is, an SiGe film in an amorphous state is grown on the seed layer (epitaxial Si layer) formed in the bottom portion of the recess, and an SiGe film in an amorphous state is grown on the seed layer (amorphous Si layer) formed in the side portion or the like of the recess. At this step, the SiGe film in an amorphous state is formed on the wafer 200, and this film is crystallized (polycrystallized) at an Si film-forming step or the like which will be described below, thereby eliminating the seam or the like contained in the SiGe film. It is considered that the reason that the seam or the like is eliminated by crystallization is that migration occurs in at least one selected from the group of Si and Ge in the SiGe film when the SiGe film in an amorphous state is crystallized or a crystal nucleus of at least one selected from the group of Si and Ge is grown, so that the seam or the like is embedded with Si or Ge. Furthermore, at this step, even if an SiGe film in a mixed crystal state of the amorphous state and the polycrystalline state (polycrystal) is formed, it is possible to achieve a certain embedding effect of the seam or the like (the aforementioned elimination effect of the seam or the like). However, it is more desirable to make the entire SiGe film be in an amorphous state that does not include a polycrystalline state, in that embedding effect of a larger seam or the like may be achieved.

In order to effectively achieve the aforementioned embedding effect of the seam or the like, it is desirable that the Ge concentration of the SiGe film formed on the wafer 200 be set to a concentration of 5 at % or larger and 80 at % or smaller, specifically 20 at % or larger and 80 at % or smaller, more specifically 50 at % or larger and 60 at % or smaller.

If the Ge concentration of the SiGe film is smaller than 5 at %, there may be a case where the crystallization of the SiGe film is difficult to go ahead under the temperature condition of the Si film-forming step as described hereinbelow, i.e., the temperature condition of the second temperature, and thus the SiGe film is maintained in an amorphous state. In this case, the aforementioned embedding effect of the seam or the like may not be achieved. By setting the Ge concentration of the SiGe film to a concentration of 5 at % or larger, it is possible to allow the crystallization of the SiGe film to go ahead under the temperature condition of the second temperature, and to cause migration in at least one selected from the group of Si and Ge in the SiGe film or to grow the crystal nucleus of at least one selected from the group of Si and Ge. This makes it possible to achieve the aforementioned embedding effect of the seam or the like. By setting the Ge concentration of the SiGe film to a concentration of 20 at % or larger, it is possible to reliably perform the crystallization of the SiGe film under the aforementioned second temperature, and to reliably achieve the aforementioned embedding effect of the seam or the like. By setting the Ge concentration of the SiGe film to a concentration of 50 at % or larger, it is possible to more reliably perform the crystallization of the SiGe film under the aforementioned second temperature, and to more reliably achieve the aforementioned embedding effect of the seam or the like.

If the Ge concentration of the SiGe film exceeds 80%, there may be a case where the SiGe film formed at this step does not become an amorphous state but may become a polycrystalline state. As a result, it may be impossible to achieve the aforementioned embedding effect of the seam or the like that should be obtained by performing the Si film-forming step or the like. By setting the Ge concentration of the SiGe film to a concentration of 80% or smaller, it is possible to make the SiGe film formed at this step be in an amorphous state, and when the Si film-forming step or the like is performed, it is possible to achieve the aforementioned embedding effect of the seam or the like. By setting the Ge concentration of the SiGe film to a concentration of 60% or smaller, it is possible to reliably make the SiGe film formed at this step be in an amorphous state, and when the Si film-forming step or the like is performed, it is possible to reliably achieve the aforementioned embedding effect of the seam or the like.

Thus, it is desirable that the Ge concentration of the SiGe film formed on the wafer 200 be set to a concentration of 5 at % or larger and 80 at % or smaller, specifically 20 at % or larger and 80 at % or smaller, more specifically 50 at % or larger and 60 at % or smaller. The SiGe film in an amorphous state having such a Ge concentration is crystallized at least by being exposed to a temperature at which the Si film in an amorphous state is formed, for example, a processing temperature (second temperature) at an Si film-forming step as described hereinbelow, thereby generating the aforementioned embedding effect of the seam or the like.

The example of the processing conditions at the SiGe film-forming step may be described as follows:

Flow rate of supplying MS gas: 10 to 2,000 sccm

Flow rate of MG gas: 10 to 2,000 sccm

Time period of supplying each gas: 1 to 300 minutes

Flow rate of supplying $N_2$ gas (per gas supply pipe): 0 to 20,000 sccm

Processing temperature (first temperature): 300 degrees C. or higher and 450 degrees C. or lower, specifically 300 degrees C. or higher and 400 degrees C. or lower, more specifically 300 degrees C. or higher and lower than 370 degrees C.

Processing pressure: 1 to 1,000 Pa, specifically 66.5 to 133 Pa.

If the processing temperature is lower than 300 degrees C., there may be a case where the deposition rate of the SiGe film formed on the wafer 200 becomes very low and the film-forming process is difficult to go ahead. By setting the processing temperature to a temperature of 300 degrees C. or higher, it is possible to allow the formation of the SiGe film on the wafer 200 to proceed at a practical deposition rate. If the processing temperature exceeds 450 degrees C., the SiGe film formed on the wafer 200 may be difficult to be in an amorphous state. For example, if the processing temperature is a temperature higher than 450 degrees C. and lower than 530 degrees C., a portion of the SiGe film formed on the wafer 200 may be in a polycrystalline (polycrystal) state. Furthermore, if the processing temperature is 530 degrees C. or higher, the entire SiGe film formed on the wafer 200 may be in a polycrystalline state. By setting the processing temperature to a temperature of 450 degrees C. or lower, it is possible to make the entire SiGe film formed on the wafer 200 be in an amorphous state. By setting the processing temperature to a temperature of 400 degrees C. or lower, it is possible to reliably achieve the aforementioned effect. Furthermore, by setting the first temperature to a temperature, which is lower than the second temperature and equal to or lower than the third temperature, it is possible to easily achieve the aforementioned effect. In addition, by setting the first temperature to a temperature, which is lower than the second temperature and lower than the third temperature, it is possible to more easily achieve the aforementioned effect.

Furthermore, if the processing temperature is set to a temperature of 300 degrees C. or higher and lower than 370 degrees C., it is not only possible to more reliably make the SiGe film formed on the wafer 200 be in an amorphous state, but also easy to increase the Ge concentration of this film. This is because the pyrolysis temperature of the MS gas is about 370 degrees C. and the pyrolysis temperature of the MG gas is about 280 degrees C. The temperature condition illustrated herein is a temperature at which the MS gas is not pyrolyzed when the MS gas exists alone in the process chamber 201 and the MG gas is pyrolyzed when the MG gas exists alone therein. Under such a temperature condition, since the pyrolysis rate of the MG gas in the process chamber 201 can be set larger than the pyrolysis rate of the MS gas in the process chamber 201, it is easy to increase the Ge concentration of the SiGe film formed on the wafer 200. Furthermore, even under the temperature condition illustrated herein, i.e., even under a relatively low temperature condition in which the MS gas is not pyrolyzed when the MS gas exists alone in the process chamber 201, it is possible to decompose the MS gas mixed with the MG gas by a catalytic action of the MG gas. This makes it possible to incorporate Si into the film formed on the wafer 200 and to allow the formation of the SiGe film on the wafer 200 to go ahead at a practical deposition rate.

After the formation of the SiGe film on the wafer 200 is completed, the valves 243a and 243c are closed to stop the supply of the MS gas and the MG gas into the process chamber 201. Then, the gas or the like remaining in the process chamber 201 is removed from the interior of the process chamber 201 according to the same processing procedures as those of the purge step of step 1 described above.

At this step, it may be possible to use, instead of the MS gas, various kinds of silicon hydride gases, various kinds of halosilane-based gases, various kinds of organosilane-based gases, or various kinds of aminosilane-based gases, described above.

Furthermore, at this step, it may be possible to use, instead of the germanium hydride gas such as the MG gas, an organogermane-based gas having a pyrolysis temperature similar to that of the MG gas or an aminogermane-based gas having a pyrolysis temperature similar to that of the MG gas.

(Temperature-Rising Step)

After the SiGe film-forming step is completed, the output of the heater 207 is adjusted so that the internal temperature of the process chamber 201, i.e., the temperature of the wafer 200, is changed from the aforementioned first temperature to the second temperature, which is higher than the first temperature. When this step is performed, the valves 243d to 243f are opened to supply an $N_2$ gas into the process chamber 201 via the nozzles 249a to 249c to purge the interior of the process chamber 201. After the internal temperature of the process chamber 201, i.e., the temperature of the wafer 200 becomes the second temperature to be stable, the Si film-forming step as described hereinbelow is initiated. The crystallization of the SiGe film formed on the wafer 200 can be initiated at this step, i.e., during the execution of the temperature-rising step. This crystallization is also successively performed and completed at the Si film-forming step as described hereinbelow.

(Si Film-Forming Step)

At this step, an MS gas is supplied from the nozzle 249a to the wafer 200 accommodated in the process chamber 201, namely to the surface of the SiGe film in an amorphous state formed on the wafer 200.

Specifically, the valve 243a is opened to allow an MS gas to flow through the gas supply pipe 232a. The flow rate of the MS gas is adjusted by the MFC 241a. The MS gas is supplied into the process chamber 201 via the nozzle 249a and is exhausted from the exhaust port 231a. At this time, the MS gas is supplied to the wafer 200. Simultaneously, the valves 243d to 243f may be opened to allow an $N_2$ gas to flow through the gas supply pipes 232d to 232f.

By supplying the MS gas to the wafer 200 under the processing condition as described hereinbelow, it is possible to adsorb (deposit) Si onto the surface of the wafer 200, namely on the SiGe film formed on the wafer 200, to form an Si film. Under the processing conditions as described hereinbelow, the crystal structure of the Si film formed on the wafer 200 becomes an amorphous state, a polycrystalline (polycrystal) state, or a mixed crystal state of the amorphous state and the polycrystalline state. Furthermore, in FIG. 5D, an example in which the Si film in an amorphous state is formed on the SiGe film is illustrated. It is desirable that the Si film be formed so as to cover the entire surface of the SiGe film.

Figure 5D:
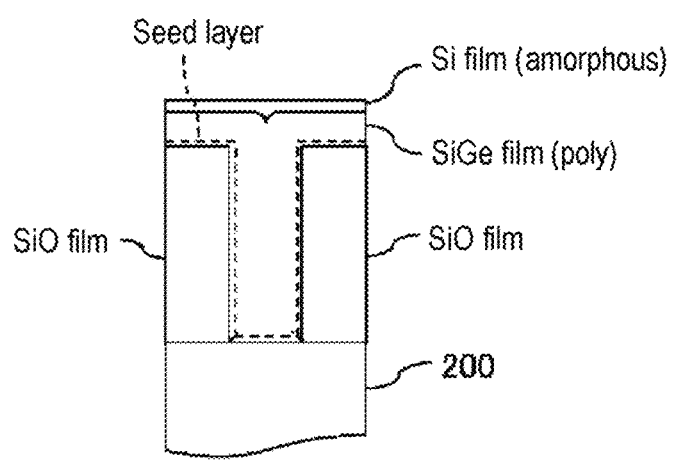
FIG. 5D is an enlarged cross sectional view of the surface of the substrate on which an Si film is formed using the SiGe film embedding the inside of the recess as a base.

By performing this step, it is possible to allow the crystallization of the SiGe film formed on the wafer 200 to further proceed. In addition, it is possible to cause migration in at least one selected from the group of Si and Ge in the SiGe film or to grow a crystal nucleus of at least one selected from the group of Si and Ge. As a result, as illustrated in FIG. 5D, it is possible to embed the seam or void contained in the SiGe film by at least one selected from the group of migration of Si or Ge and growth of crystal nucleus of Si or Ge so as to eliminate them. Furthermore, the phenomena such as the migration of Si or Ge accompanying the crystallization of the SiGe film, the growth of crystal nucleus of Si or Ge, or the like may proceed not only at the Si film-forming step but also at the temperature-rising step described above.

The example of the processing conditions at the Si film-forming step may be described as follows:

Flow rate of supplying MS gas: 10 to 2,000 sccm

Time period of supplying MS gas: 1 to 300 minutes

Flow rate of supplying $N_2$ gas (per gas supply pipe): 0 to 20,000 sccm

Processing temperature (second temperature): 500 to 650 degrees C.

Processing pressure: 30 to 200 Pa.

In addition, by setting the processing temperature to 550 degrees C. or lower, specifically 530 degrees C. or lower, it is possible to form an Si film in an amorphous state; by setting the processing temperature to 600 degrees C. or higher, it is possible to form an Si film in a polycrystalline state; and by setting the processing temperature to an intermediate temperature between 550 degrees C. and 600 degrees C., it is possible to form an Si film in a mixed crystal state of the amorphous state and the polycrystalline state.

After the formation of the Si film on the wafer 200 and the crystallization of the SiGe film are each completed, the valve 243a is closed to stop the supply of the MS gas into the process chamber 201. Then, the gas or the like remaining in the process chamber 201 is removed from the interior of the process chamber 201 according to the same processing procedures as those of the purge step of step 1 described above.

At this step, it may be possible to use, instead of the MS gas, various kinds of silicon hydride gases and various kinds of halosilane-based gases described above.

(After Purge and Atmospheric Pressure Return)

After the Si film-forming step is completed, an $N_2$ gas as a purge gas is supplied from the respective nozzles 249*a* to 249*c* into the process chamber 201 while dropping the internal temperature the process chamber 201, i.e., the temperature of the wafer 200, from the second temperature to the third temperature (temperature dropping), and is exhausted from the exhaust port 231*a*. Thus, the interior of the process chamber 201 is purged, and the gas or the reaction byproduct, which remains in the process chamber 201, is removed from the interior of the process chamber 201 (after purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the manifold 209. The processed wafers 200 supported by the boat 217 are unloaded from the lower end of the manifold 209 to the outside of the reaction tube 203 (boat unloading). After the boat unloading, the shutter 219*s* is moved so that the lower end opening of the manifold 209 is sealed by the shutter 219*s* via the O-ring 220*c* (shutter closing). The processed wafers 200 are unloaded to the outside of the reaction tube 203 and are subsequently discharged from the boat 217 (wafer discharging).

(3) Effects According to the Present Embodiment

According to the present embodiment, one or more effects as set forth below may be achieved.

(a) At the SiGe film-forming step, the SiGe film in an amorphous state is formed so as to embed the inside of the recess formed on the surface of the wafer 200, and at the subsequent Si film-forming step, the SiGe film is crystallized, thereby eliminating the seam or the like contained in the SiGe film in an amorphous state. That is, it is possible to improve the embedding characteristic by the SiGe film in the recess formed on the surface of the wafer 200.

(b) At the SiGe film-forming step, by setting the Ge concentration of the SiGe film formed on the wafer 200 to a concentration of 5 at % or larger and 80 at % or smaller, specifically 20 at % or larger and 80 at % or smaller, more specifically 50 at % or larger and 60 at % or smaller, it is possible to reliably achieve the aforementioned embedding effect of the seam or the like (the elimination effect of the seam or the like).

(c) At the SiGe film-forming step, by setting the processing temperature (first temperature) to a temperature of 300 degrees C. or higher and 450 degrees C. or lower, specifically 300 degrees C. or higher and 400 degrees C. or lower, more specifically 300 degrees C. or higher and lower than 370 degrees C., it is possible to reliably achieve the aforementioned embedding effect of the seam or the like (the elimination effect of the seam).

(d) By setting the first temperature≤the third temperature<the second temperature, it is possible to efficiently and effectively achieve the aforementioned embedding effect of the seam or the like. Furthermore, by setting the first temperature<the third temperature<the second temperature, it is possible to more efficiently and effectively achieve the aforementioned embedding effect of the seam or the like. In addition, by controlling the balance of the processing temperature between the respective steps in this way, it is possible to perform efficiently and effectively the series of processing by causing an appropriate reaction at each step.

(e) By selecting a relatively low temperature as the processing temperature (second temperature) at the Si film-forming step so that the Si film formed on the SiGe film becomes an amorphous state, it is possible to satisfactorily manage the heat history of the wafer 200. Furthermore, by selecting a relatively high temperature as the processing temperature (second temperature) at the Si film-forming step so that the Si film formed on the SiGe film is in a polycrystalline state or a mixed crystal state of the amorphous state and the polycrystalline state, it is possible to activate migration or nucleation of Si or Ge in the SiGe film and to shorten the time required for crystallization.

(f) By initiating the crystallization of the SiGe film during the execution of the temperature-rising step and completing the crystallization at the Si film-forming step, it is possible to shorten the time required for the overall substrate processing.

(g) By forming the Si film on the SiGe film, it is possible to avoid oxidation of the SiGe film, i.e., an increase in resistance of the SiGe film, when the wafer 200 is exposed to the air, or the like. In addition, by forming the Si film so as to cover the entire surface of the SiGe film, it is possible to reliably avoid oxidation of the SiGe film over the entire main surface thereof (h) According to the method of the present embodiment, it is possible to enhance the embedding characteristics of the inside of the recess without using a relatively complicated process (DED process) such as deposition→etching→deposition. Thus, it is possible to simplify the control of the substrate processing and to improve the productivity of the substrate processing.

(i) According to the method of the present embodiment, since the DED process is not used, it tends to be easy to improve the surface roughness or the like of the film formed on the wafer 200. The "surface roughness" used herein may mean a height difference (surface roughness) of the film in the plane of the wafer. The fact that the surface roughness is good may mean that the surface of the film becomes smooth.

(j) By performing the seed layer-forming step, it is possible to shorten the incubation time of the SiGe film and to shorten the time required for the overall substrate processing. In addition, at the seed layer-forming step, it is possible to enhance the step coverage of the seed layer or to densify the seed layer by using the treatment effect by the DCS gas.

(k) The effects mentioned above can be similarly achieved in the case where various kinds of Si-containing gases described above other than the MS gas and the DS gas are used, or in the case where various kinds of halogen element-containing gases described above other than the DCS are used, or in the case where various kinds of Ge-containing gases described above other than the MG gas are used, or in the case where various kinds of inert gases described above other than the $N_2$ gas are used.

(4) Exemplary Modifications

The present embodiment is not limited to the aforementioned film-forming sequence but may be modified as in the modifications described below. These modifications may be arbitrarily combined. Unless specially otherwise specified, the processing procedures and processing conditions at each step of each of the modifications may be similar to the processing procedures and processing conditions at each step of the aforementioned substrate processing sequence.
(Modification 1)

Figure 6A:
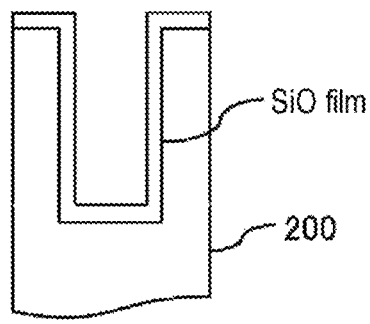
FIG. 6A is an enlarged cross sectional view of a surface of a substrate having, on the surface, a recess whose bottom portion and side portion are respectively formed of an insulating film.

As illustrated in FIG. 6A, the series of processing described above may be performed on a wafer 200 in which a recess is formed on the surface of the wafer 200 and a bottom portion and a side portion of the recess are respectively formed of an insulating film such as an SiO film or the like.

Figure 6B:
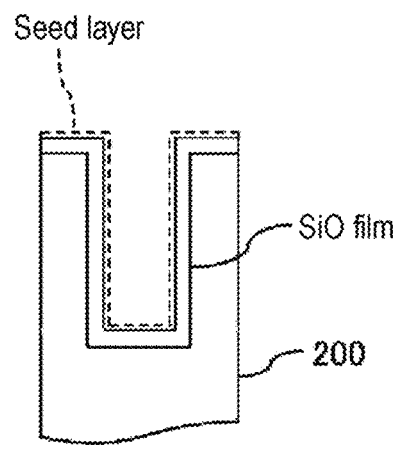
FIG. 6B is an enlarged cross sectional view of the surface of the substrate in which a seed layer is formed on an inner surface of the recess.
Figure 6C:
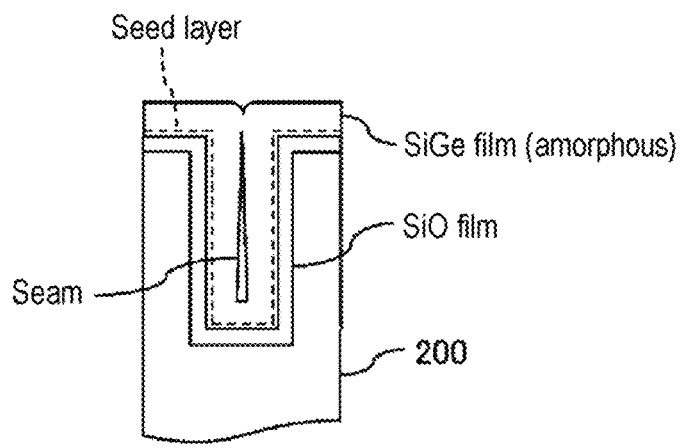
FIG. 6C is an enlarged cross sectional view of the surface of the substrate on which an SiGe film is formed so as to embed the inside of the recess.

In this case, by performing a step similar to the aforementioned seed layer-forming step, as illustrated in FIG. 6B, an amorphous Si layer may be grown as a seed layer (Si seed layer) on an SiO film. Furthermore, by performing a step similar to the aforementioned temperature-dropping step and a step similar to the aforementioned SiGe film-forming step, as illustrated in FIG. 6C, an SiGe film in an amorphous state may be formed on the amorphous Si layer as the seed layer.

Figure 6D:
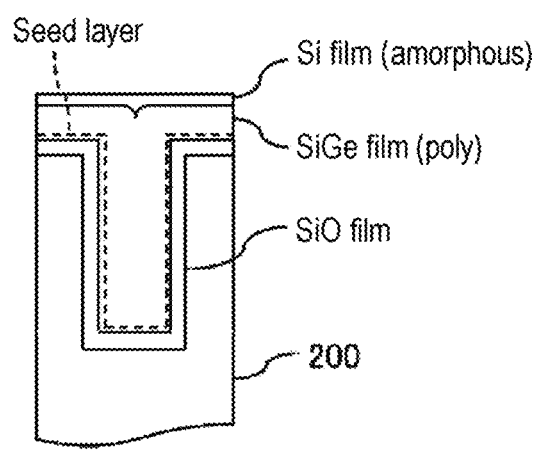
FIG. 6D is an enlarged cross sectional view of the surface of the substrate on which an Si film is formed using the SiGe film embedding the inside of the recess as a base.

Then, by sequentially performing a step similar to the aforementioned temperature-rising step and a step similar to the aforementioned Si film-forming step, as illustrated in FIG. 6D, it is possible to eliminate a seam or the like contained in the SiGe film in an amorphous state by crystallizing the SiGe film which becomes a base while forming an Si film in an amorphous state, in a polycrystalline state or in a mixed crystal state of the amorphous state and the polycrystalline state on the SiGe film. Furthermore, in FIG. 6D, an example in which an Si film in an amorphous state is formed on the SiGe film is illustrated. Even in this modification, the same effects as those of the film-forming sequence described above may be achieved.
(Modification 2)

As in the film-forming sequence illustrated below, at the seed layer-forming step, the halogen element-containing gas described above such as a DCS gas and various kinds of aminosilane-based gases described above such as a DIPAS gas may be alternately supplied to the wafer 200. Even in this modification, the same effects as those of the film-forming sequence described above may be achieved.

(DCS→DIPAS)×$n$→MS+MG→MS⇒Si/SiGe/Seed (DIPAS→DCS)×$n$→MS+MG→MS⇒Si/SiGe/Seed (Modification 3)

As in the film-forming sequence illustrated below, at the seed layer-forming step, the halogen element-containing gas such as a DCS gas may not be supplied to the wafer 200 but various kinds of aminosilane-based gases described above such as a DIPAS gas or various kinds of silicon hydride gases described above such as a DS gas may be supplied to the wafer 200. Even in this modification, the same effects as those of the film-forming sequence described above may be achieved.

DIPAS→MS+MG→MS⇒Si/SiGe/Seed

DS→MS+MG→MS⇒Si/SiGe/Seed (DIPAS→DS)×$n$→MS+MG→MS⇒Si/SiGe/Seed (DS→DIPAS)×$n$→MS+MG→MS⇒Si/SiGe/Seed (Modification 4)

As in the film-forming sequence illustrated below, at the seed layer formation step, a halogen element-containing gas such as an HCl gas and an Si-containing gas such as a DS gas may be sequentially supplied to the wafer 200. Even in this modification, the same effects as those of the film-forming sequence described above may be achieved.

HCl→DS→MS+MG→MS⇒Si/SiGe/Seed (Modification 5)

As in the film-forming sequence illustrated below, the seed layer-forming step may not be performed. Even in this modification, substantially the same effects as those of the film-forming sequence described above may be achieved.

MS+MG→MS⇒Si/SiGe (Modification 6)

As in the film-forming sequence illustrated below, at the SiGe film-forming step, an MS gas and an MG gas may be alternately supplied. Even in this modification, the same effect as those of the film-forming sequence described above may be achieved.

(DCS→DS)×$n_1$→(MS→MG)×$n_2$→MS⇒Si/SiGe/Seed (DCS→DS)×$n_1$→(MG→MS)×$n_2$→MS⇒Si/SiGe/Seed (Modification 7)

As in the film-forming sequence illustrated below, at at least one selected from the group of the SiGe film-forming step and the Si film-forming step, the valve 243g is opened and a PH gas is supplied to the wafer 200 to dope P into the film (the SiGe film or Si film) formed on the wafer 200. Even in this modification, the same effects as those of the film-forming sequence described above may be achieved.

(DCS→DS)×$n$→MS+MG+PH→MS⇒Si/P-doped SiGe/Seed (DCS→DS)×$n$→MS+MG→MS+PH⇒P-doped Si/SiGe/Seed (DCS→DS)×$n$→MS+MG+PH→MS+PH⇒P-doped Si/P-doped Si/Seed The supply flow rate of the PH gas may be set to a flow rate which falls within a range of, for example, 0.1 to 500 sccm. Furthermore, it may be possible to use, instead of the PH gas, a gas containing an element (P, arsenic (As) or the like) which is group V element such as a phosphorous acid ($H_3PO_3$) gas, a phosphoryl chloride ($POCl_3$) gas, or an arsine ($AsH_3$) gas or the like, and which becomes a solid by itself. In addition, it may be possible to use, instead of these gases containing group V element, a gas containing an element (boron (B) or the like) gas which is group III element such as a diborane ($B_2H_6$) gas, a trichloroborane ($BCl_3$) gas or the like, and which becomes a solid by itself, or the like.

Other Embodiments

While one embodiment of the present disclosure has been specifically described above, the present disclosure is not limited to the aforementioned embodiment but may be differently modified without departing from the spirit of the present disclosure.

In the aforementioned embodiment, there has been described an example in which the supply of various kinds of gases (an Si-containing gas, a Ge-containing gas, a halogen element-containing gas, a dopant gas, and an inert gas) into the process chamber 201 is performed using the plurality of nozzles 249a to 249c having substantially the same length (height), but the present disclosure is not limited the aforementioned embodiment. For example, the supply of various kinds of gases into the process chamber 201 may be performed using a plurality of nozzles having different lengths (heights) configured to inject gases from a plurality of portions having different heights in the process chamber 201. With this configuration, it is possible to finely adjust the distribution of the partial pressure of various kinds of gases in the process chamber 201 in the height direction, and to improve the thickness uniformity of the film formed on the wafer 200 between the wafers (the uniformity in the arrangement).

Recipes used in substrate processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the contents of the substrate processing. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type process furnace. The present disclosure is not limited to the aforementioned embodiment but may be appropriately applied to a case where films are formed using a substrate processing apparatus provided with a cold-wall-type process furnace.

In the case of using these substrate processing apparatuses, a film-forming process may be performed by the sequences and processing conditions similar to those of the embodiment and modifications described above. Effects similar to those of the embodiment and modifications described above may be achieved.

Since the SiGe film formed by the method of the aforementioned embodiment has high embedding characteristics in the recess and has low resistivity by inclusion of Ge, it can be suitably used for applications such as formation of a contact plug by means of embedding a contact hole.

The embodiment, modifications and the like described above may be appropriately combined with one another. The processing procedures and processing conditions at this time may be similar to, for example, the processing procedures and processing conditions of the aforementioned embodiment.

EXAMPLES

Figure 7A:
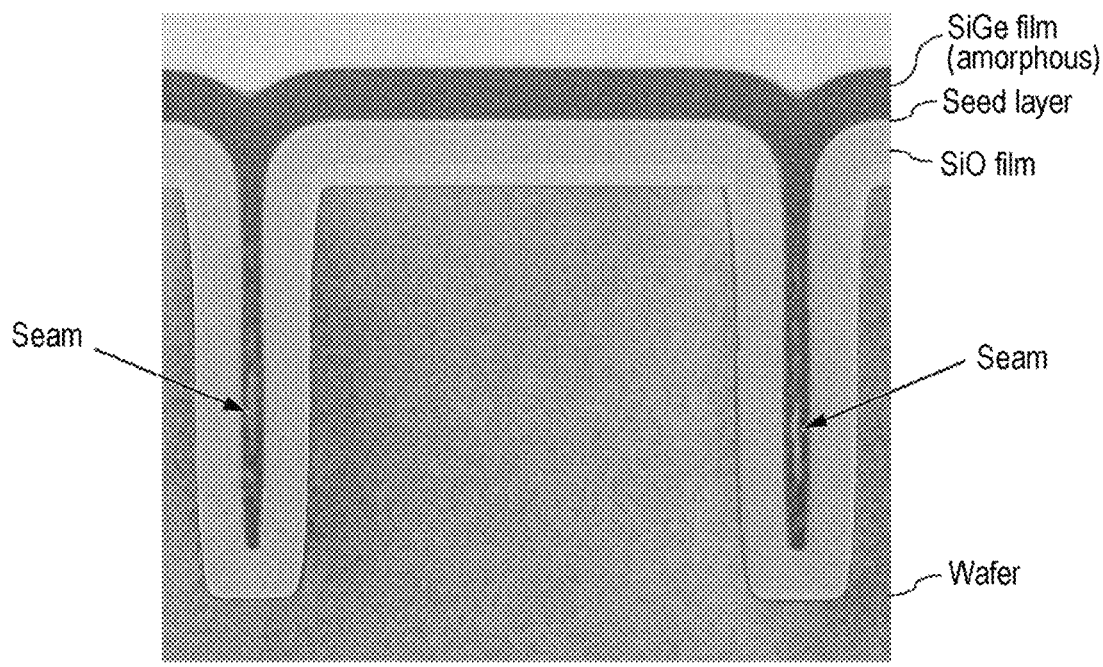
FIG. 7A is an enlarged cross sectional photograph of a surface of a substrate after a seed layer and an SiGe film are sequentially formed in a recess of the substrate and before an Si film is formed.
Figure 7B:
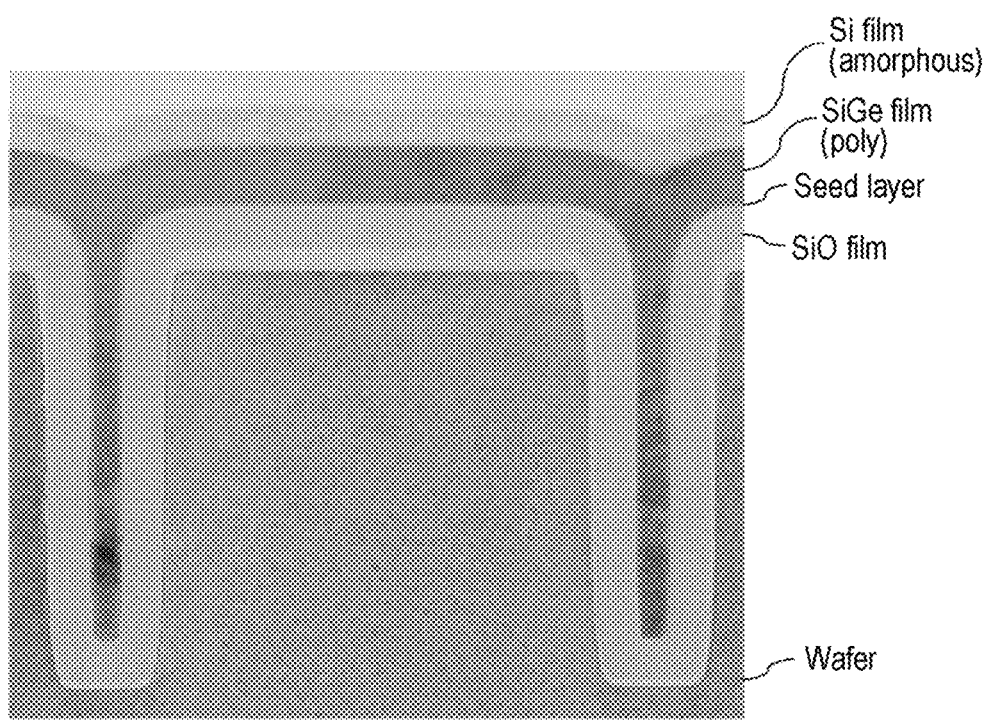
FIG. 7B is an enlarged cross sectional photograph of the surface of the substrate after the seed layer and the SiGe film are sequentially formed in the recess of the substrate and the Si film is further formed using the SiGe film as a base.

In example 1, a seed layer, an SiGe film and an Si film were sequentially formed on a wafer having a recess whose bottom portion and side portion are respectively formed of an SiO film, on a surface of the wafer, by the film-forming sequence illustrated in FIG. 4 using the substrate processing apparatus illustrated in FIG. 1. At the Si film-forming step, a temperature condition was selected such that the Si film formed on the SiGe film was in an amorphous state. Other processing conditions were set to predetermined conditions which fall within the processing condition range described in the aforementioned embodiment. Then, the state of the inside of the recess after the execution of the SiGe film-forming step and before the execution of the Si film-forming step (before crystallization of the SiGe film), and the state of the inside of the recess after the execution of the Si film-forming step (after crystallization of the SiGe film) were respectively observed. FIG. 7A shows an SEM photograph of the inside of the recess before crystallization of the SiGe film, and FIG. 7B shows an SEM photograph of the inside of the recess after crystallization of the SiGe film. It can be seen that, according to FIG. 7A, the SiGe film before the crystallization has a seam, whereas according to FIG. 7B, the SiGe film after the crystallization has no seam. That is, it can be seen that, by performing a series of steps from the seed layer-forming step to the Si film-forming step, it is possible to eliminate the seam contained in the SiGe film in an amorphous state and to make the SiGe film formed in the recess be in a seamless state.

Figure 8:
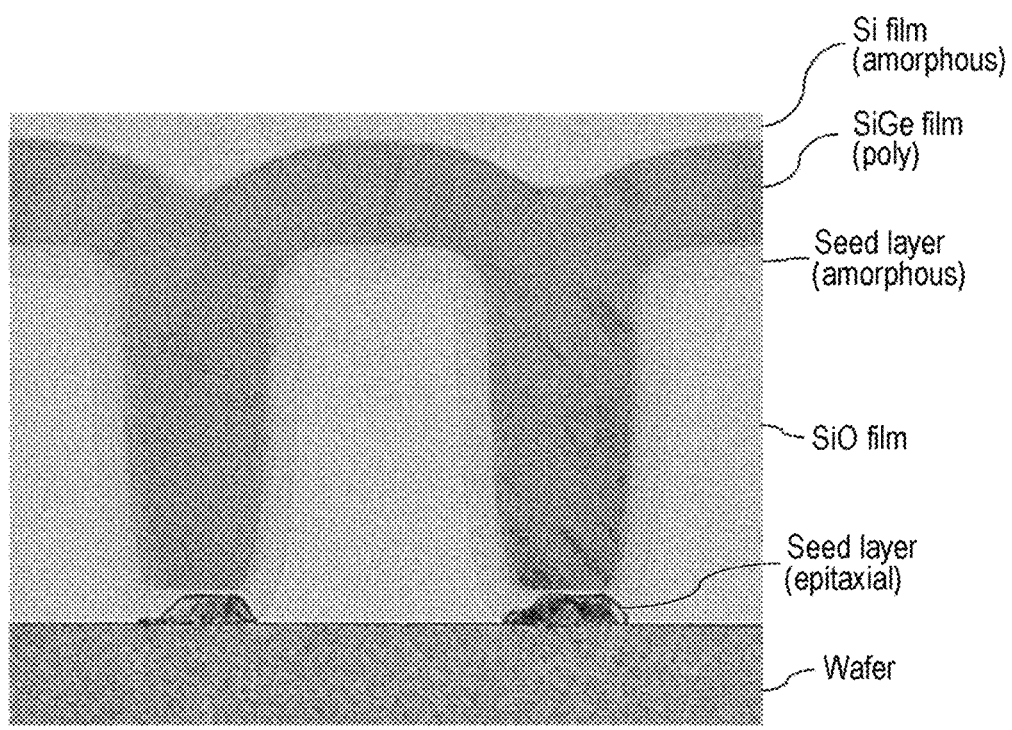
FIG. 8 is an enlarged cross sectional photograph of a surface of a substrate after a seed layer and an SiGe film are sequentially formed in a recess of the substrate and an Si film is further formed using the SiGe film as a base.

In example 2, a seed layer, an SiGe film and an Si film were sequentially formed on a wafer having a recess whose bottom portion is made of single crystal Si and side portion is formed of an SiO film, on its surface, by the film-forming sequence illustrated in FIG. 4 using the substrate processing apparatus illustrated in FIG. 1. The processing conditions at each step were similar to those of each step of example 1. Then, the state of the inside of the recess after the execution of the SiGe film-forming step (after crystallization of the SiGe film) was observed. FIG. 8 shows an SEM photograph of the inside of the recess after crystallization of the SiGe film. According to FIG. 8, it can be seen that the SiGe film after the crystallization has no seam. That is, it can be seen that, by performing a series of steps from the seed layer-forming step to the Si film-forming step, as in example 1, it is possible to make the SiGe film formed in the recess be in a seamless state. Furthermore, as shown in FIG. 8, it can be seen that, even after crystallization of the SiGe film, the seed layer on the single crystal Si is maintained in an epitaxial state, and the seed layer on the SiO film is maintained in an amorphous state.

According to the present disclosure in some embodiments, it is possible to improve embedding characteristics by a film in a recess formed on a surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) forming a silicon germanium film in an amorphous state so as to embed an inside of a recess formed on a surface of a substrate, by supplying a first silicon-containing gas and a germanium-containing gas to the substrate at a first temperature, the silicon germanium film including a seam or void;

(b) raising a temperature of the substrate from the first temperature to a second temperature, which is higher than the first temperature; and (c) forming a silicon film on the silicon germanium film by supplying a second silicon-containing gas to the substrate at the second temperature, wherein in (c), the silicon germanium film as a base of the silicon film is crystallized while the silicon film is formed, and wherein the seam or void is eliminated as the silicon germanium film is crystalized.

2. The method according to claim 1, wherein the silicon germanium film formed in (a) has a germanium concentration of 5 at % or larger and 80 at % or smaller.

3. The method according to claim 1, wherein the silicon germanium film formed in (a) has a germanium concentration of 20 at % or larger and 80 at % or smaller.

4. The method according to claim 1, wherein the silicon germanium film formed in (a) has a germanium concentration of 50 at % or larger and 60 at % or smaller.

5. The method according to claim 1, wherein the silicon germanium film formed in (a) is crystallized at least by being exposed to a temperature at which a silicon film in an amorphous state is formed.

6. The method according to claim 1, wherein the first temperature is set to 300 degrees C. or higher and 450 degrees C. or lower.

7. The method according to claim 1, wherein the first temperature is set to 300 degrees C. or higher and 400 degrees C. or lower.

8. The method according to claim 1, wherein the first temperature is set to a temperature at which the first silicon-containing gas is not pyrolyzed when the first silicon-containing gas exists alone, and at which the germanium-containing gas is pyrolyzed when the germanium-containing gas exists alone.

9. The method according to claim 1, wherein the silicon film formed in (c) is in an amorphous state, a polycrystalline state, or a mixed crystal state of the amorphous state and the polycrystalline state.

10. The method according to claim 1, wherein the silicon film formed in (c) is in an amorphous state.

11. The method according to claim 1, wherein the crystallization of the silicon germanium film is initiated during an execution period of (b), and the crystallization is completed in (c).

12. The method according to claim 1, wherein migration occurs in at least one selected from the group of silicon and germanium in the silicon germanium film by the crystallization of the silicon germanium film in (c), or in (b) and (c).

13. The method according to claim 1, wherein a crystal nucleus of at least one selected from the group of silicon and germanium in the silicon germanium film is grown by the crystallization of the silicon germanium film in (c), or in (b) and (c).

14. The method according to claim 1, further comprising:

(d) forming a seed layer on an inner surface of the recess by supplying a third silicon-containing gas to the substrate at a third temperature, which is equal to or higher than the first temperature and lower than the second temperature, wherein (d) is performed before (a).

15. The method according to claim 1, further comprising:

(d) forming a seed layer on an inner surface of the recess by supplying a third silicon-containing gas to the substrate at a third temperature, which is higher than the first temperature and lower than the second temperature; and (e) dropping the temperature of the substrate from the third temperature to the first temperature, wherein (d) and (e) are performed before (a).

16. The method according to claim 14, wherein a bottom portion of the recess is made of single crystal silicon, and a side portion of the recess is formed of an insulating film, wherein in (d), an epitaxial silicon layer is grown as the seed layer on the single crystal silicon, and an amorphous silicon layer is grown as the seed layer on the insulating film, and wherein in (a), the silicon germanium film in the amorphous state is grown on the epitaxial silicon layer, and the silicon germanium film in the amorphous state is grown on the amorphous silicon layer.

17. The method according to claim 14, wherein a bottom portion and a side portion of the recess are formed of an insulating film, wherein in (d), an amorphous silicon layer is grown as the seed layer on the insulating film, and wherein in (a), the silicon germanium film in the amorphous state is grown on the amorphous silicon layer.

18. A substrate processing apparatus, comprising:

a process chamber in which a substrate is processed;

a first supply system configured to supply a silicon-containing gas to the substrate in the process chamber;

a second supply system configured to supply a germanium-containing gas to the substrate in the process chamber;

a heater configured to heat the substrate in the process chamber; and a controller configured to control the first supply system, the second supply system, and the heater so as to perform in the process chamber:

(a) forming a silicon germanium film in an amorphous state so as to embed an inside of a recess formed on a surface of the substrate, by supplying a first silicon-containing gas and the germanium-containing gas to the substrate at a first temperature, the silicon germanium film including a seam or void;

(b) raising a temperature of the substrate from the first temperature to a second temperature, which is higher than the first temperature; and (c) forming a silicon film on the silicon germanium film by supplying a second silicon-containing gas to the substrate at the second temperature, wherein in (c), the silicon germanium film as a base of the silicon film is crystallized while the silicon film is formed, and wherein the seam or void is eliminated as the silicon germanium film is crystallized.

19. A non-transitory computer-readable recording medium storing a program that causes, by a computer, a substrate processing apparatus to perform a process in a process chamber of the substrate processing apparatus, the process comprising:

(a) forming a silicon germanium film in an amorphous state so as to embed an inside of a recess formed on a surface of a substrate, by supplying a first silicon-containing gas and a germanium-containing gas to the substrate at a first temperature, the silicon germanium film including a seam or void;

(b) raising a temperature of the substrate from the first temperature to a second temperature, which is higher than the first temperature; and (c) forming a silicon film on the silicon germanium film by supplying a second silicon-containing gas to the substrate at the second temperature, wherein in (c), the silicon germanium film as a base of the silicon film is crystallized while the silicon film is formed, and wherein the seam or void is eliminated as the silicon germanium film is crystallized.

\* \* \* \* \*